US006227877B1

(12) United States Patent
Mou et al.

(10) Patent No.: US 6,227,877 B1
(45) Date of Patent: May 8, 2001

(54) ELECTRICAL CONTACT

(75) Inventors: Chi-Tung Mou, Tainan; Gwou-Jong Tseng; Yu-San Hsiao, both of Tu-Chen, all of (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/199,004

(22) Filed: Nov. 23, 1998

(30) Foreign Application Priority Data

Nov. 22, 1997 (TW) ........................................ 86219639

(51) Int. Cl.[7] .......................... H01R 12/00; H05K 1/00

(52) U.S. Cl. .......................................... 439/83; 439/876

(58) Field of Search .......................... 439/83, 493, 495, 439/876

(56) References Cited

U.S. PATENT DOCUMENTS

| | | | | |
|---|---|---|---|---|
| 4,662,694 | * | 5/1987 | Coller et al. | 339/275 T |
| 4,808,113 | * | 2/1989 | Kanesige et al. | 439/67 |
| 5,395,250 | * | 3/1995 | Englert, Jr. et al. | 439/65 |
| 5,411,420 | * | 5/1995 | Dennis | 439/876 |
| 5,632,629 | * | 5/1997 | Legrady | 439/78 |

* cited by examiner

*Primary Examiner*—Lincoln Donovan
*Assistant Examiner*—Richard K. Lee

(57) ABSTRACT

An electrical contact includes a main body having a contact arm (11) extending from a lower portion thereof, a tail (13) extending from an upper portion thereof, and a retainer (13) projecting from the main body between the contact arm and the tail. A cutout (133) is defined in a surface of the tail opposite a surface designed to engages with a PCB. A guiding slot (132) is defined in the main body of the contact between the tail and the contact arm opposite the retainer. When the tail is soldered to the PCB, any excess solder will flow along the contact. The cutout provides an obstruction and the guiding slot provides a surface area for the solder to solidify on the contact without covering a portion of the contact arm and hindering signal transmission.

6 Claims, 3 Drawing Sheets

ELECTRICAL CONTACT

BACKGROUND OF THE INVENTION

1. Field of the Invention

The present invention relates to an electrical contact, and particularly to an electrical contact for surface mounting to a printed circuit board whereby excess solder will not hinder signal transmission.

2. The Prior Art

The trend of the computer industry continues toward miniaturization. Notebook and hand held computers both require an efficient use of internal space to include the necessary hardware within a housing of limited size. In desktop computers, a printed circuit board (PCB) is commonly provided with through holes for connecting components on one surface with components on the opposite surface of the PCB. However, such through holes occupy too much space on the PCB. Therefore, a surface mounting contact 4, as shown in FIGS. 3 and 4, has been introduced for surface mounting to both sides of a PCB 3.

The contact 4 includes a contacting end 41 for electrically engaging with a contact pad formed on an electrical card (not shown), a tail 42 opposite the contacting end 41 for surface mounting to the PCB 3, and a retaining portion 43 formed between the contacting end 41 and the tail 42 for retention in a housing 33 of an SO DIMM connector. A continuous face 44 is formed between the tail 42 and the contacting end 41 opposite the retaining portion 43. The tail 42 is electrically engaged with a contact pad 31 on the PCB 3 by means of solder 32. After surface mounting of the connector to one side of the PCB 3, the PCB 3 with the associated connector is handled in an upside-down manner to surface mount other components on the other side of the PCB, so that liquefied solder or excess solder 32 has a tendency, due to gravity, to flow downward along the continuous face 44 and cover a substantial portion of the contacting end 41. Since the contacting end 41 is gold-coated for facilitating high speed signal transmission, the excess solder 32 formed on the contacting end 41 will hinder signal transmission.

Hence, an improved electrical contact is needed to overcome the disadvantages of surface mount soldering conventional electrical contacts.

SUMMARY OF THE INVENTION

Accordingly, an objective of the present invention is to provide an electrical contact defining a guiding slot in a main body thereof for increasing the surface area of the contact whereby excess solder will solidify within the slot and will not adversely affect signal transmission.

An additional objective of the present invention is to provide an electrical contact defining a cutout in a tail thereof for obstructing the flow of excess solder along the contact when the contact is surface mounted to a PCB.

To fulfill the above mentioned objectives, an electrical contact in accordance with the present invention electrically connects a connector with a PCB. The contact includes a main body having a contact arm extending from a lower portion thereof for engaging with a card inserted into the connector, a tail extending from an upper portion thereof for being surface mounted to the PCB, and a retainer projecting from the main body between the contact arm and the tail for supporting the contact within a housing of the connector. A cutout is defined in a surface of the tail opposite the surface which engages with the PCB. A guiding slot is defined in the main body of the contact between the tail and the contact arm opposite the retainer. When the tail is soldered to the PCB, any excess solder will flow downward from the PCB and along the contact. The cutout provides an obstruction and the guiding slot provides sufficient surface area for the solder to solidify on the contact without covering a portion of the contact arm and hindering signal transmission.

These and additional objects, features, and advantages of the present invention will become apparent after reading the following detailed description of the preferred embodiment of the present invention taken in conjunction with the appended drawing figures.

DETAILED DESCRIPTION OF THE PREFERRED EMBODIMENT

Reference will be made in detail to the preferred embodiment of the present invention.

Figure 1:
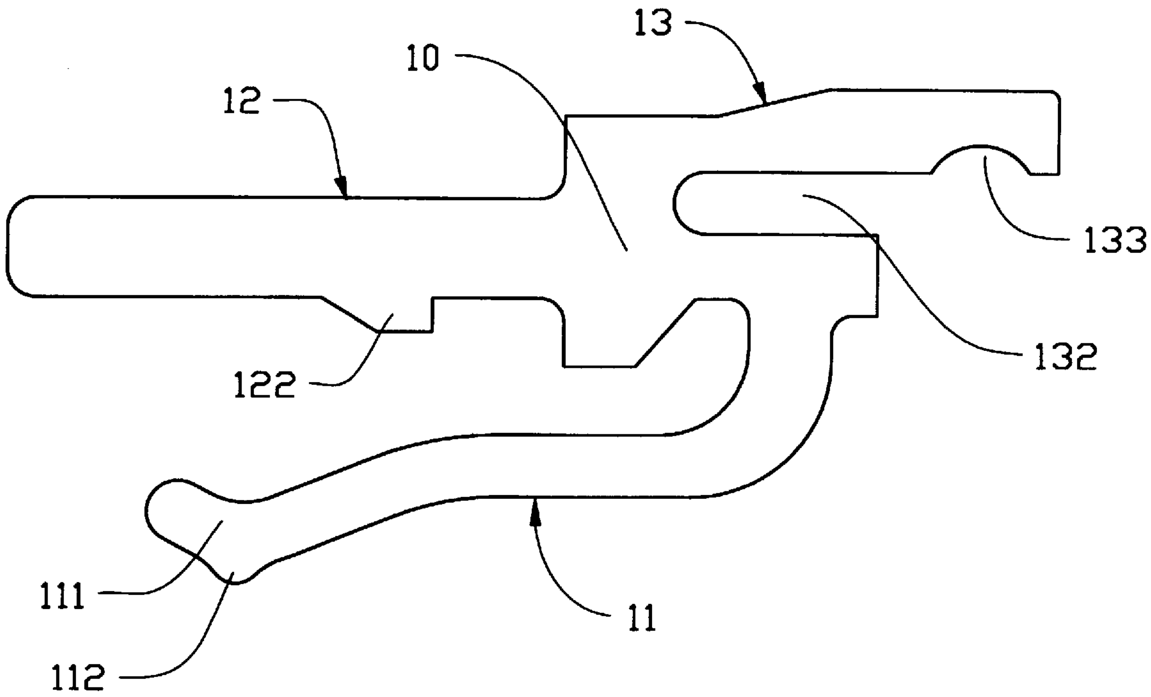
FIG. 1 is a side view of an electrical contact in accordance with a preferred embodiment of the present invention.
Figure 2:
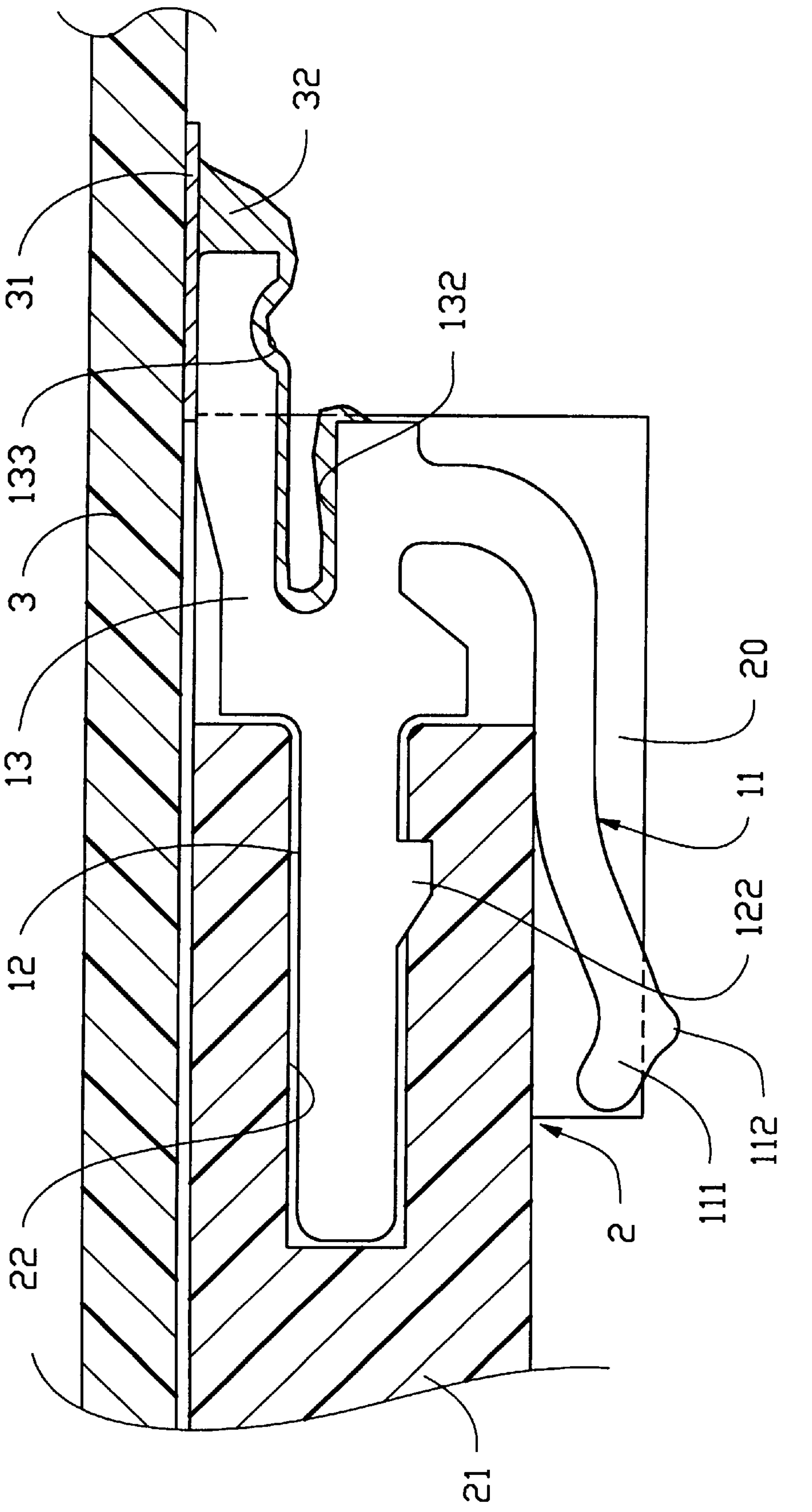
FIG. 2 is a cross-sectional view showing the contact of FIG. 1 surface mounted to a PCB and received in a housing of a connector.
Figure 3:
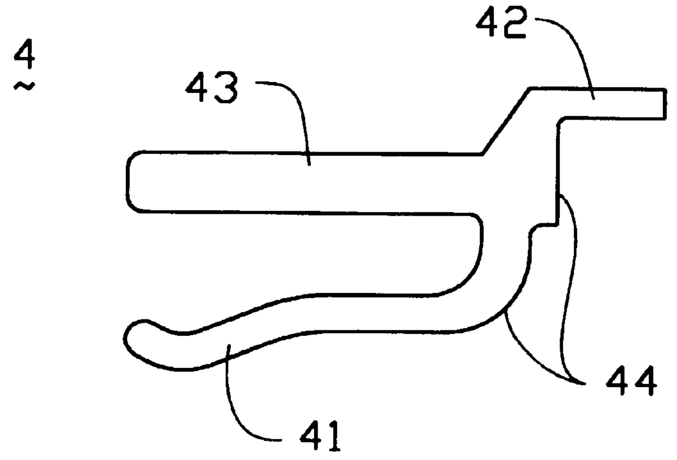
FIG.3 (PRIOR ART)
FIG. 3 is a side view of a conventional electrical contact.
Figure 4:
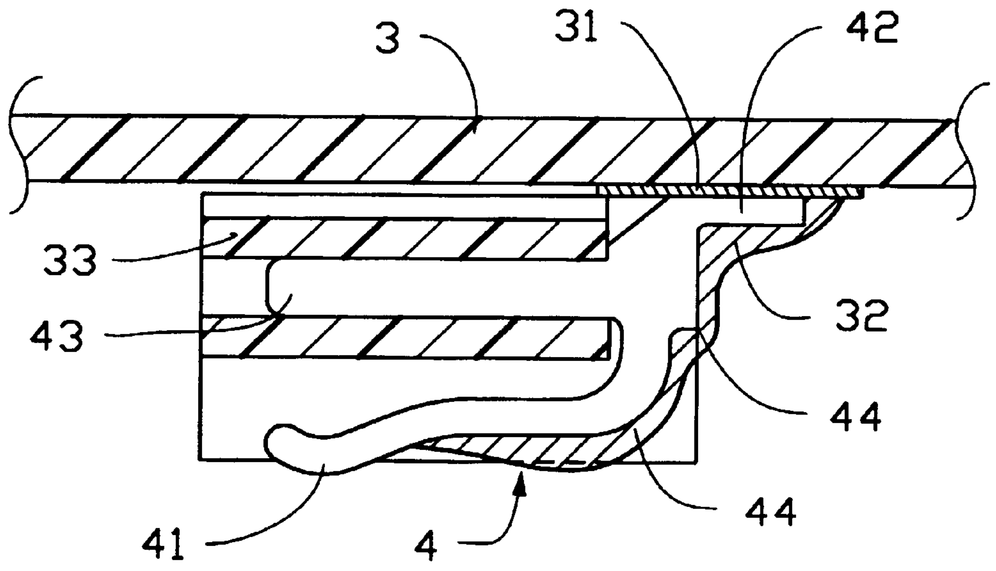
FIG.4 (PRIOR ART)
FIG. 4 is a cross-sectional view showing the contact of FIG. 3 surface mounted to a PCB and received in a housing of a connector.

Referring to FIGS. 1 and 2, an electrical contact 1 in accordance with the present invention connects an electrical connector 2 with a PCB 3. The contact 1 comprises a main body 10 having a contact arm 11 extending from a lower portion thereof, a tail 13 extending from an upper portion thereof, and a retainer 12 projecting from the main body 10 between the contact arm 11 and the tail 13.

Please note that the present invention is specifically designed for use with assembly procedures wherein:

(a) the contact 1 is soldered to a lower surface of the PCB 3 (with the soldering step occurring while the contact 1 is beneath the PCB 3), or (b) the contact 1 is first soldered to the PCB 3 (from a position above the PCB 3) and the PCB 3 is later inverted and other components are soldered to an opposite side of the PCB 3, so that there is a possibility of reflow of the solder attaching the contact 1 to the PCB 3.

The retainer 12 is received in a first passageway 22 defined in an insulative housing 21 of the connector 2 which may be an SO DIMM connector. The retainer 12 forms a barb 122 on a bottom portion thereof for interferentially engaging with the housing 21.

The contact arm 11 extends into a second passageway 20 defined in the housing 21 of the connector 2. The contact arm 11 forms a tip 111 at an end thereof. A gold-coated projection 112 extends from the contact arm 11 near the tip 111 and projects beyond a bottom face of the housing 21 for engagement with a contact pad formed on a card (not shown) inserted into the connector 2.

The tail 13 is surface mounted to a contact pad 31 formed on the PCB 3 by solder 32. A cutout 133 is defined in a surface of the tail 13 opposite the surface which engages with the contact pad 31 of the PCB 3. A guiding slot 132 is defined in the main body 10 of the contact 1 between the tail 13 and the contact arm 11 opposite the retainer 12. When the tail 13 is soldered to the contact pad 31, any excess solder 32 will flow downward from the PCB 3 and along the contact 1. The cutout 133 provides an obstruction and the guiding slot 132 provides sufficient surface area for the solder 32 to solidify on the contact 1 without covering a portion of the contact arm 11 and hindering signal transmission.

While the present invention has been described with reference to a specific embodiment, the description is illustrative of the invention and is not to be construed as limiting the invention. Various modifications to the present invention can be made to the preferred embodiment by those skilled in the art without departing from the true spirit and scope of the invention as defined by the appended claims.

We claim:

1. An electrical contact for connecting an electrical connector with a PCB, comprising a main body having a contact arm extending from a lower portion thereof, and a tail extending from an upper portion thereof for surface mounting to the PCB, the main body forming a guiding slot between the tail and the contact arm, so that when the tail is soldered to the PCB, any liquefied excess solder will flow downward therefrom along the tail and into the guiding slot where it will solidify, a cutout being defined in a surface of the tail opposite the surface which engages with the PCB for obstructing the flow of excess solder along the tail, and said guiding slot penetrating through the main body in a direction perpendicular to the main body.

2. The contact as described in claim 1, wherein a retainer projects from the main body between the contact arm and the tail, and the guiding slot extends opposite said retainer.

3. The contact as described in claim 2, wherein the retainer is received in a first passageway defined in an insulative housing of the connector.

4. The contact as described in claim 3, wherein the contact arm extends into a second passageway defined in the housing of the connector.

5. The contact as described in claim 4, wherein the contact arm forms a tip at an end thereof.

6. The contact as described in claim 5, wherein a gold-coated projection extends from the contact arm near the tip and projects beyond a bottom face of the housing.

* * * * *